US012565713B2

(12) United States Patent
Wang et al.

(10) Patent No.: US 12,565,713 B2
(45) Date of Patent: Mar. 3, 2026

(54) METHOD FOR PREPARING GALLIUM NITRIDE (GaN) SINGLE-CRYSTAL SUBSTRATE WITH EDGE METAL MASK TECHNOLOGY

(71) Applicant: Peking University, Beijing (CN)

(72) Inventors: Xinqiang Wang, Beijing (CN); Fang Liu, Beijing (CN); Qiang Liu, Beijing (CN); Yucheng Guo, Beijing (CN); Tao Wang, Beijing (CN); Jiejun Wu, Beijing (CN); Bo Shen, Beijing (CN); Guoyi Zhang, Beijing (CN)

(73) Assignee: Peking University, Beijing (CN)

( * ) Notice: Subject to any disclaimer, the term of this patent is extended or adjusted under 35 U.S.C. 154(b) by 281 days.

(21) Appl. No.: 18/370,243

(22) Filed: Sep. 19, 2023

(65) Prior Publication Data

US 2025/0092572 A1     Mar. 20, 2025

(51) Int. Cl.
| | |
|---|---|
| *C30B 29/40* | (2006.01) |
| *C30B 25/04* | (2006.01) |
| *C30B 25/08* | (2006.01) |
| *C30B 25/14* | (2006.01) |
| *C30B 25/16* | (2006.01) |
| *H10P 14/20* | (2026.01) |
| *H10P 14/24* | (2026.01) |

(52) U.S. Cl.
CPC ............ *C30B 29/406* (2013.01); *C30B 25/04* (2013.01); *C30B 25/08* (2013.01); *C30B 25/14* (2013.01); *C30B 25/165* (2013.01); *H10P 14/24* (2026.01); *H10P 14/3416* (2026.01)

(58) Field of Classification Search
CPC ......... C30B 25/04; C30B 25/08; C30B 25/14; C30B 25/165; C30B 29/406; H01L 21/02458; H01L 21/0254; H01L 21/0262
See application file for complete search history.

(56) References Cited

U.S. PATENT DOCUMENTS

2022/0282397 A1* 9/2022 Leroux ................. H01L 21/304

FOREIGN PATENT DOCUMENTS

CN          115074824 A  *  9/2022  ............. C30B 25/16

* cited by examiner

*Primary Examiner* — Hua Qi
(74) *Attorney, Agent, or Firm* — Tutunjian & Bitetto, P.C.

(57) ABSTRACT

The present disclosure provides a method for preparing a gallium nitride (GaN) single-crystal substrate with an edge metal mask technology. The method includes: preparing a metal mask ring on a composite epitaxial substrate, epitaxially growing a GaN single-crystal sacrificial layer in a confined manner, performing separation with interlayer decoupling of single-crystal graphene through an in-situ temperature gradient method to obtain a self-supporting GaN single-crystal sacrificial layer, epitaxially growing a GaN single-crystal thick film in a diameter expanded manner, and performing chemico-mechanical trimming on the GaN single-crystal thick film to obtain a stress-free self-supporting GaN single-crystal substrate. The metal mask ring is compatible with the GaN single-crystal preparation process (hydride vapor phase epitaxy (HVPE)), and efficiently catalyzes decomposition reaction of the nitrogen source. While prohibiting edge growth of the GaN single-crystal thick film, the present disclosure improves a crystalline quality of the GaN single-crystal substrate.

7 Claims, 3 Drawing Sheets

METHOD FOR PREPARING GALLIUM NITRIDE (GaN) SINGLE-CRYSTAL SUBSTRATE WITH EDGE METAL MASK TECHNOLOGY

TECHNICAL FIELD

The present disclosure relates to preparation of gallium nitride (GaN) single-crystal substrates, and in particular to a method for preparing a GaN single-crystal substrate with an edge metal mask technology.

BACKGROUND

Hexagonal nitride semiconductors such as a GaN semiconductor are preferred materials for preparing electronic and photoelectronic devices, and have important applications in the fields of fifth-generation (5G) communication, solid-state lighting, etc. The GaN single-crystal substrate is considered as a preferred substrate for preparing high-performance nitride semiconductor devices. This substrate is mainly prepared with a hydride vapor phase epitaxy (HVPE) at home and abroad, other than a conventional single crystal preparation method such as zone melting and czochralski. The preparation process is briefly described as follows: With Sapphire ($Al_2O_3$) as an epitaxial substrate, a GaN single-crystal thick film with a thickness of 100 μm is prepared. Through methods such as laser lift-off (LLO) and nanogrids, the GaN single-crystal thick film is separated from the epitaxial substrate to obtain a self-supporting GaN single-crystal substrate. When the GaN single-crystal thick film with the thickness of 100 μm is prepared, due to high-index facets exposed at an edge of the thick film, anisotropic growth at the edge is caused. Consequently, there are cladding between the thick film and the epitaxial substrate, stress accumulation at the edge of the thick film, unintentional doping, etc., such that a quality and a yield of the GaN single-crystal substrate prepared with the HVPE are restricted. At present, the epitaxial substrate is put into a graphite crucible having a groove to realize the HVPE of the GaN single-crystal thick film. Through a groove sidewall with a height of 0.5-1.0 mm, edge growth of the GaN single-crystal thick film with the thickness of 0.5-1.0 mm is restricted. However, the groove sidewall made of graphite allows attached growth of polycrystalline GaN structures. Due to polycrystalline GaN particles on the groove sidewall, a steady air flow required by the growth of the GaN single-crystal thick film on the epitaxial substrate is damaged, resulting in size reduction (diameter reduction) of the single-crystal substrate, attachment of surface polycrystalline particles, thickness restriction of the single-crystal substrate, etc.

SUMMARY

In view of the above problems in the prior art, the present disclosure provides a method for preparing a GaN single-crystal substrate with an edge metal mask technology.

A method for preparing a GaN single-crystal substrate with an edge metal mask technology includes the following steps:

1) preparing a metal mask ring:

providing a composite epitaxial substrate, the composite epitaxial substrate sequentially including a biaxial stress free nitrogen-lattice polar GaN epitaxial thin film, wrinkle-free multilayer single-crystal graphene, and a metal-lattice polar GaN single-crystal template from top to bottom, where the nitrogen-lattice polar GaN epitaxial thin film serves as a front surface of the composite epitaxial substrate; and depositing the metal mask ring at an edge of the front surface of the composite epitaxial substrate, where the metal mask ring is circular, located at an edge of the composite epitaxial substrate, and connected to the composite epitaxial substrate fully and stably; and an outer diameter of the metal mask ring is the same as a diameter of the composite epitaxial substrate;

2) growing a GaN single-crystal sacrificial layer in a confined manner:

epitaxially growing the GaN single-crystal sacrificial layer in the confined manner on the front surface of the composite epitaxial substrate in an HVPE chamber with HVPE, where in an epitaxial growth process, a gallium (Ga) metal atom provided by an III-group source chemically reacts with a nitrogen (N) atom provided by a nitrogen source (ammonia or $NH_3$); the metal mask ring catalyzes decomposition of the ammonia, thereby blocking attached growth of nitride on the metal mask ring, and prohibiting anisotropic growth of an edge of epitaxial nitride on the composite epitaxial substrate extending toward the metal mask ring; the GaN single-crystal sacrificial layer is confined in a region surrounded by the metal mask ring for growth; and the GaN single-crystal sacrificial layer is not connected to the metal-lattice polar GaN single-crystal template in the composite epitaxial substrate in any direction; and further adjusting a flow of the III-group source and a flow of the nitrogen source, thereby controlling a growth rate of the GaN single-crystal sacrificial layer, and controlling a thickness of the GaN single-crystal sacrificial layer to be smaller than a height of the metal mask ring;

3) performing separation with an in-situ temperature gradient method to obtain a self-supporting GaN single-crystal sacrificial layer:

keeping the composite epitaxial substrate with the GaN single-crystal sacrificial layer unchanged spatially in the HVPE chamber; quickly cooling an environmental temperature to a low temperature in situ; and introducing a thermal stress in a horizontal direction through a time-domain temperature gradient, such that a binding force between the nitrogen-lattice polar GaN epitaxial thin film and the single-crystal graphene, and a binding force between the metal-lattice polar GaN single-crystal template and the single-crystal graphene are greater than an interlayer binding force of the single-crystal graphene, thereby realizing interlayer decoupling on the single-crystal graphene to obtain a composite structure composed of the self-supporting GaN single-crystal sacrificial layer that is continuous and intact in transverse and longitudinal dimensions and can be grown secondarily in situ, the nitrogen-lattice polar GaN epitaxial thin film and the single-crystal graphene and a composite structure composed of the single-crystal graphene and the metal-lattice polar GaN single-crystal template;

4) performing diameter expanded and epitaxial growth to obtain a GaN single-crystal thick film:

taking out the composite structure composed of the single-crystal graphene and the metal-lattice polar GaN single-crystal template out of the HVPE chamber, heating the HVPE chamber, and growing the GaN single-crystal thick film in a diameter expanded manner on a front surface of the GaN single-crystal sacrificial layer, where when a total thickness of the GaN single-crystal thick film and the GaN single-crystal sacrificial layer is not greater than the height of the metal mask ring, the GaN single-crystal thick film is grown in the confined manner, specifically a transverse growth rate is zero; and when the thickness of the GaN single-crystal thick film and the GaN single-crystal sacrificial layer is greater than the height of the metal mask ring, a confinement effect of the metal mask ring is weakened, and the GaN single-crystal thick film is grown transversely in the diameter expanded manner to obtain the GaN single-crystal thick film; and 5) performing chemico-mechanical trimming on the GaN single-crystal thick film to obtain a stress-free self-supporting GaN single-crystal substrate.

In step 1), the composite epitaxial substrate has the diameter of 25-200 mm, and a thickness of 5-10 μm; the GaN epitaxial thin film has a thickness of 5-10 μm; the single-crystal graphene has a thickness equivalent to a plurality of atomic layers; the metal-lattice polar GaN single-crystal template has a thickness of 300-1,500 μm; and the metal mask ring has an inner diameter less than the diameter of the composite epitaxial substrate by 0.5-2 mm, and has a height of 20-50 μm. The metal mask ring is made of tungsten or zirconium.

In step 2), the flow of the III-group source and the flow of the nitrogen source are adjusted, such that the GaN single-crystal sacrificial layer on the composite epitaxial substrate has a transverse growth rate of 0 μm/h to block the attached growth of the nitride on the metal mask ring, and a longitudinal growth rate of 10-200 μm/h; and finally, the GaN single-crystal sacrificial layer has the thickness smaller than the height of the metal mask ring by 5-20 μm, and a diameter smaller than an inner diameter of the metal mask ring by 0.04-0.2 mm. The epitaxial growth is performed at 1,000-1,100° C. With the larger flow of the III-group source and the larger flow of the nitrogen source, the longitudinal growth rate is faster, the growth time is longer, and the thickness of the GaN single-crystal sacrificial layer is greater.

In step 3), the GaN single-crystal sacrificial layer and the composite epitaxial substrate are kept unchanged spatially in the HVPE chamber; and the environmental temperature is quickly cooled to the low temperature in situ from 1,000-1,100° C., with a temperature gradient being 400-600° C., and a cooling rate being greater than 20° C./min.

In step 4), the GaN single-crystal thick film is grown in the diameter expanded manner on the front surface of the GaN single-crystal sacrificial layer at 1,000-1,100° C.: when the total thickness of the GaN single-crystal thick film and the GaN single-crystal sacrificial layer is not greater than the height of the metal mask ring, the GaN single-crystal thick film is grown in the confined manner, and has a longitudinal growth rate of 10-200 μm/h and a transverse growth rate of 0 μm/h; and when the thickness of the GaN single-crystal thick film and the GaN single-crystal sacrificial layer is greater than the height of the metal mask ring, the confinement effect of the metal mask ring is weakened, the GaN single-crystal thick film is grown in the diameter expanded manner and has a longitudinal growth rate of 10-200 μm/h, a transverse growth rate being $\frac{1}{50}$-$\frac{1}{5}$ of the longitudinal growth rate, a longitudinal grown thickness of 1-10 mm, and a transverse expanded size being 1.05-1.5 times a difference between the inner diameter and the outer diameter of the metal mask ring.

In step 5), the chemico-mechanical trimming includes two steps: performing mechanical cutting to remove the composite structure composed of the GaN single-crystal sacrificial layer, the nitrogen-lattice polar GaN epitaxial thin film and the single-crystal graphene under the GaN single-crystal thick film, as well as an irregular region caused by anisotropic growth at the edge of the GaN single-crystal thick film, thereby obtaining a cylindrical GaN single-crystal thick film with a diameter same as the diameter of the composite epitaxial substrate; and thermally treating the cylindrical GaN single-crystal thick film for 30-60 min at 500-700° C. in a hydrogen atmosphere having a vacuum degree of less than 1 Pa, to remove surface impurities of the GaN single-crystal thick film and surface damage caused by the mechanical cutting, and release a biaxial stress caused by the epitaxial growth and the mechanical cutting in the GaN single-crystal thick film, thereby obtaining the stress-free self-supporting GaN single-crystal substrate without diameter reduction and with a thickness of 1-10 mm.

The present disclosure has the following advantages:

The mask ring is made of the tungsten metal. The tungsten metal is compatible with the GaN single-crystal preparation process (HVPE), and efficiently catalyzes decomposition reaction of the nitrogen source (ammonia or $NH_3$) in the HVPE. While prohibiting edge growth of the GaN single-crystal thick film, the present disclosure improves a crystalline quality of the GaN single-crystal substrate, and increases a curvature radius of the GaN single-crystal substrate. The GaN single-crystal sacrificial layer and the composite epitaxial substrate are separated by means of inter-layer decoupling of the single-crystal graphene to prevent mismatch stress accumulation and diameter reduction of the self-supporting GaN single-crystal substrate.

DETAILED DESCRIPTION OF THE EMBODIMENTS

The present disclosure will be further described below by means of particular embodiments with reference to the accompanying drawings.

Figures 1, 2:
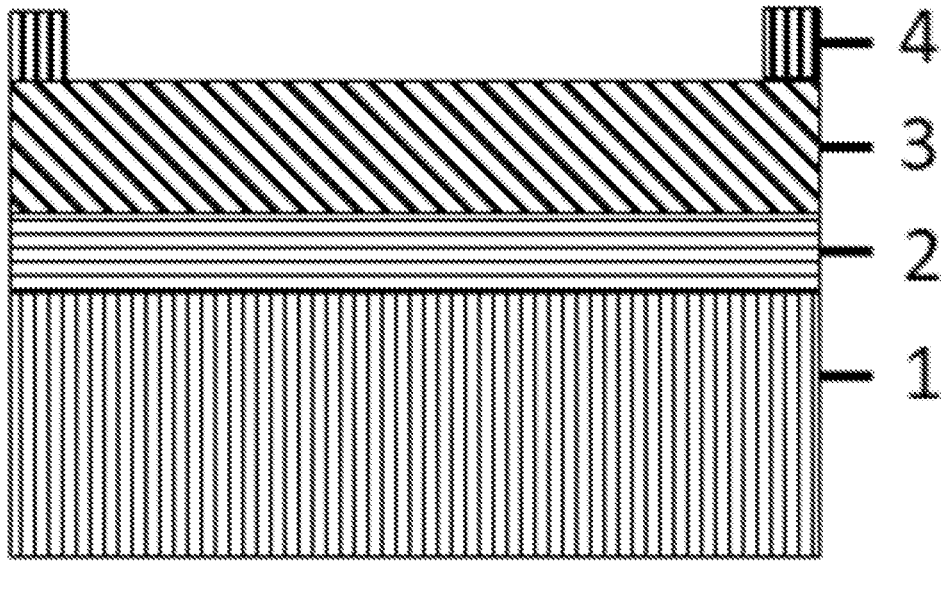
FIG. 1 is a sectional view of a metal mask ring obtained in a method for preparing a GaN single-crystal substrate with an edge metal mask technology according to an embodiment of the present disclosure.
FIG. 2 is a sectional view of a GaN single-crystal sacrificial layer obtained in a method for preparing a GaN single-crystal substrate with an edge metal mask technology according to an embodiment of the present disclosure.

An embodiment provides a method for preparing a GaN single-crystal substrate with an edge metal mask technology, including the following steps:

1) As shown in FIG. 1, a composite epitaxial substrate with a diameter of 100 mm is provided. From top to bottom, the composite epitaxial substrate sequentially includes a biaxial stress free nitrogen-lattice polar GaN epitaxial thin film 3 having a thickness of 10 μm, wrinkle-free multilayer single-crystal graphene 2 having a thickness equivalent to two atomic layers, and a metal-lattice polar GaN single-crystal template 1 having a thickness of 500 μm. A metal mask ring 4 having an outer diameter of 100 mm, an inner diameter of 99 mm, and a height of 40 μm is manufactured at an edge of an upper surface of the GaN epitaxial thin film. The metal mask ring 4 is made of tungsten.

2) As shown in FIG. 2, a GaN single-crystal sacrificial layer 5 having a thickness of 30 μm is epitaxially grown in a confined manner at 1,050° C. on a front surface of the composite epitaxial substrate with HVPE. A gallium (Ga) metal atom provided by an III-group source chemically reacts with a nitrogen (N) atom provided by ammonia. The metal mask ring catalyzes decomposition of the ammonia, thereby blocking attached growth of nitride on the metal mask ring, and prohibiting anisotropic growth of an edge of epitaxial nitride on the composite epitaxial substrate extending toward the metal mask ring. A flow of the III-group source and a flow of the nitrogen source are adjusted, thereby controlling a growth rate of the GaN single-crystal sacrificial layer. The GaN single-crystal sacrificial layer has a longitudinal growth rate of 40 μm/h, and a diameter of 98.9 mm, and is not connected to the metal-lattice polar GaN single-crystal template in the composite epitaxial substrate in any direction.

Figure 3:
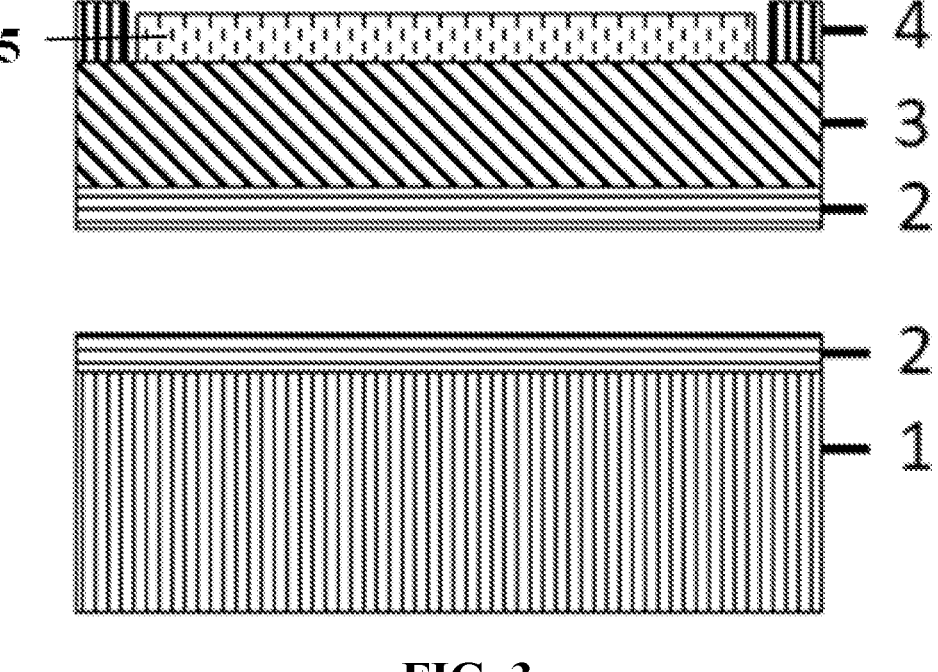
FIG. 3 is a sectional view of a self-supporting GaN single-crystal sacrificial layer separated in a method for preparing a GaN single-crystal substrate with an edge metal mask technology according to an embodiment of the present disclosure.

3) As shown in FIG. 3, the composite epitaxial substrate with the GaN single-crystal sacrificial layer is kept unchanged spatially in the HVPE chamber. An environmental temperature is quickly cooled to 550° C. from 1,050° C., with a temperature gradient being 500° C., and a cooling rate being 25° C./min. A thermal stress is introduced in a horizontal direction through a time-domain temperature gradient, such that a binding force between the nitrogen-lattice polar GaN epitaxial thin film and the single-crystal graphene, and a binding force between the metal-lattice polar GaN single-crystal template and the single-crystal graphene are greater than an interlayer binding force of the single-crystal graphene, thereby realizing interlayer decoupling on the single-crystal graphene. After the interlayer decoupling, two single-crystal graphene sheets each have a thickness equivalent to one atomic layer. Therefore, a composite structure composed of the self-supporting GaN single-crystal sacrificial layer that is continuous and intact in transverse and longitudinal dimensions and can be grown secondarily in situ, the nitrogen-lattice polar GaN epitaxial thin film and the single-crystal graphene, and a composite structure composed of the single-crystal graphene and the metal-lattice polar GaN single-crystal template are obtained.

Figure 4:
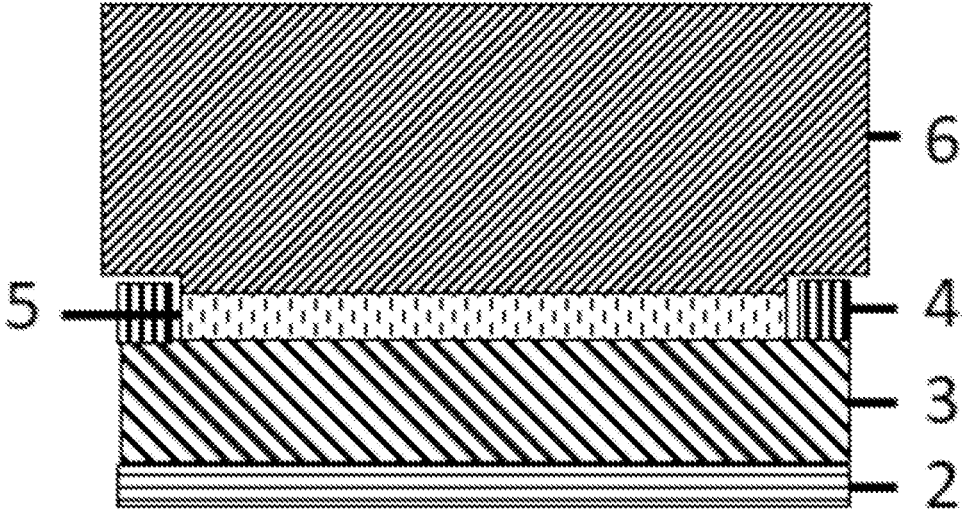
FIG. 4 is a sectional view of a GaN single-crystal thick film obtained in a method for preparing a GaN single-crystal substrate with an edge metal mask technology according to an embodiment of the present disclosure.

4) The composite structure composed of the graphene having the thickness equivalent to the single atomic layer and the metal-lattice polar GaN single-crystal template is taken out of the chamber. The HVPE chamber is heated to 1,050° C. A GaN single-crystal thick film is grown in a diameter expanded manner on an upper surface of the composite structure composed of the GaN single-crystal sacrificial layer, the nitrogen-lattice polar GaN epitaxial thin film and the single-crystal graphene. Specifically, when a thickness of the GaN single-crystal thick film is not greater than 10 μm, the GaN single-crystal thick film is grown in the confined manner, and has a longitudinal growth rate of 40 μm/h and a transverse growth rate of 0 μm/h. When the thickness of the GaN single-crystal thick film is greater than 10 μm, the GaN single-crystal thick film is grown in the diameter expanded manner and has a longitudinal growth rate of 50 μm/h, a transverse growth rate being ⅕ of the longitudinal growth rate, a longitudinal grown thickness of 7.5 mm, and a transverse diameter expanded size being 1.5 times (1.5 mm) a difference (1 mm) between the inner diameter and the outer diameter of the metal mask ring. The obtained GaN single-crystal thick film 6 is as shown in FIG. 4.

Figure 5:
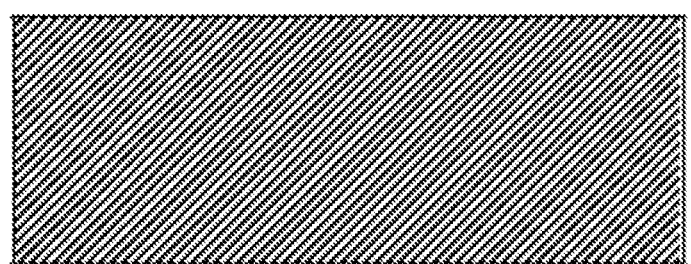
FIG. 5 is a sectional view of a self-supporting GaN single-crystal substrate obtained in a method for preparing a GaN single-crystal substrate with an edge metal mask technology according to an embodiment of the present disclosure.
Figure 5:
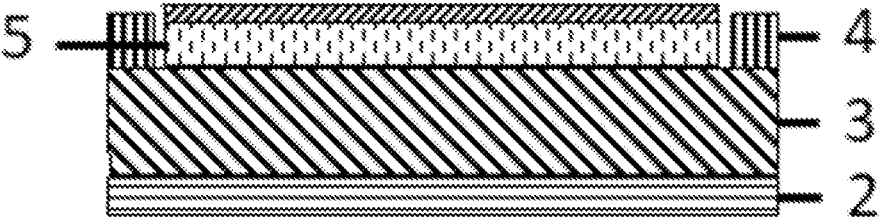

5) Mechanical cutting is performed to remove the composite structure composed of the GaN single-crystal sacrificial layer, the nitrogen-lattice polar GaN epitaxial thin film and the single-crystal graphene under the GaN single-crystal thick film, as well as an irregular region caused by anisotropic growth at the edge of the GaN single-crystal thick film, thereby obtaining a cylindrical GaN single-crystal thick film 6 with a diameter of 100 mm and a thickness of 7.5 mm. The cylindrical GaN single-crystal thick film is thermally treated for 40 min at 600° C. in a hydrogen atmosphere having a vacuum degree of 0.5 Pa, to remove surface impurities of the GaN single-crystal thick film and surface damage caused by the mechanical cutting, and release a biaxial stress caused by the epitaxial growth and the mechanical cutting in the GaN single-crystal thick film, thereby obtaining the stress-free self-supporting GaN single-crystal substrate with a diameter of 100 mm and a thickness of 7.5 mm, as shown in FIG. 5.

Finally, it should be noted that disclosure of the embodiments is intended to help further understand the present disclosure. However, those skilled in the art can understand that various substitutions and modifications may be made without departing from the spirit and scope of the present disclosure and the appended claims. Therefore, the present disclosure should not be limited to the content disclosed in the embodiments, and the scope of protection claimed by the present disclosure is subject to the scope defined by the claims.

What is claimed is:

1. A method for preparing a gallium nitride (GaN) single-crystal substrate with an edge metal mask technology, comprising the following steps:

1) preparing a metal mask ring including:

providing a composite epitaxial substrate, the composite epitaxial substrate sequentially comprising a biaxial stress free nitrogen-lattice polar GaN epitaxial thin film, wrinkle-free multilayer single-crystal graphene, and a metal-lattice polar GaN single-crystal template from top to bottom, wherein the nitrogen-lattice polar GaN epitaxial thin film serves as a front surface of the composite epitaxial substrate; and depositing the metal mask ring at an edge of the front surface of the composite epitaxial substrate, wherein the metal mask ring is circular, located at an edge of the composite epitaxial substrate, and connected to the composite epitaxial substrate; and an outer diameter of the metal mask ring is the same as a diameter of the composite epitaxial substrate;

2) growing a GaN single-crystal sacrificial layer in a confined manner including:

epitaxially growing the GaN single-crystal sacrificial layer in the confined manner on the front surface of the composite epitaxial substrate in a hydride vapor phase epitaxy (HVPE) chamber with HVPE, wherein in an epitaxial growth process, a gallium metal atom provided by an III-group source chemically reacts with a nitrogen atom provided by a nitrogen source; the metal mask ring catalyzes decomposition of ammonia, thereby blocking attached growth of nitride on the metal mask ring, and prohibiting anisotropic growth of an edge of epitaxial nitride on the composite epitaxial substrate extending toward the metal mask ring; the GaN single-crystal sacrificial layer is confined in a region surrounded by the metal mask ring for growth; and the GaN single-crystal sacrificial layer is not connected to the metal-lattice polar GaN single-crystal template in the composite epitaxial substrate in any direction; and further adjusting a flow of the III-group source and a flow of the nitrogen source, thereby controlling a growth rate of the GaN single-crystal sacrificial layer, and controlling a thickness of the GaN single-crystal sacrificial layer to be smaller than a height of the metal mask ring;

3) performing separation with an in-situ temperature gradient method to obtain a self-supporting GaN single-crystal sacrificial layer including:

keeping the composite epitaxial substrate with the GaN single-crystal sacrificial layer unchanged spatially in the HVPE chamber; cooling an environmental temperature in situ; and introducing a thermal stress in a horizontal direction through a time-domain temperature gradient, such that a binding force between the nitrogen-lattice polar GaN epitaxial thin film and the single-crystal graphene, and a binding force between the metal-lattice polar GaN single-crystal template and the single-crystal graphene are greater than an interlayer binding force of the single-crystal graphene, thereby realizing interlayer decoupling on the single-crystal graphene to obtain a composite structure composed of the self-supporting GaN single-crystal sacrificial layer that is grown secondarily in situ, the nitrogen-lattice polar GaN epitaxial thin film and the single-crystal graphene, and a composite structure composed of the single-crystal graphene and the metal-lattice polar GaN single-crystal template;

4) performing diameter expanded and epitaxial growth to obtain a GaN single-crystal thick film including:

taking out the composite structure composed of the single-crystal graphene and the metal-lattice polar GaN single-crystal template out of the HVPE chamber, heating the HVPE chamber, and growing the GaN single-crystal thick film in a diameter expanded manner on a front surface of the GaN single-crystal sacrificial layer, wherein when a total thickness of the GaN single-crystal thick film and the GaN single-crystal sacrificial layer is not greater than the height of the metal mask ring, the GaN single-crystal thick film is grown in the confined manner; and when the thickness of the GaN single-crystal thick film and the GaN single-crystal sacrificial layer is greater than the height of the metal mask ring, a confinement effect of the metal mask ring is weakened, and the GaN single-crystal thick film is grown transversely in the diameter expanded manner to obtain the GaN single-crystal thick film; and 5) performing chemico-mechanical trimming on the GaN single-crystal thick film to obtain a stress-free self-supporting GaN single-crystal substrate.

2. The method according to claim 1, wherein in step 1), the composite epitaxial substrate has the diameter of 25-200 mm, and a thickness of 5-10 um; the GaN epitaxial thin film has a thickness of 5-10 um; the single-crystal graphene has a thickness equivalent to a plurality of atomic layers; the metal-lattice polar GaN single-crystal template has a thickness of 300-1,500 um; and the metal mask ring has an inner diameter less than the diameter of the composite epitaxial substrate by 0.5-2 mm, and has the height of 20-50 um.

3. The method according to claim 1, wherein in step 1), the metal mask ring is made of tungsten or zirconium.

4. The method according to claim 1, wherein in step 2), the flow of the Ill-group source and the flow of the nitrogen source are adjusted, such that the GaN single-crystal sacrificial layer on the composite epitaxial substrate has a transverse growth rate of 0 $\mu m/h$ to block the attached growth of the nitride on the metal mask ring, and a longitudinal growth rate of 10-200 $\mu m/h$; and finally, the GaN single-crystal sacrificial layer has the thickness smaller than the height of the metal mask ring by 5-20 $\mu m$, and a diameter smaller than an inner diameter of the metal mask ring by 0.04-0.2 mm.

5. The method according to claim 1, wherein in step 2), the epitaxial growth is performed at 1,000-1,100° C.

6. The method according to claim 1, wherein in step 4), the GaN single-crystal thick film is grown in the diameter expanded manner on the front surface of the GaN single-crystal sacrificial layer at 1,000-1,100° C.: when the total thickness of the GaN single-crystal thick film and the GaN single-crystal sacrificial layer is not greater than the height of the metal mask ring, the GaN single-crystal thick film is grown in the confined manner, and has a longitudinal growth rate of 10-200 $\mu m/h$ and a transverse growth rate of 0 $\mu m/h$; and when the thickness of the GaN single-crystal thick film and the GaN single-crystal sacrificial layer is greater than the height of the metal mask ring, the confinement effect of the metal mask ring is weakened, and the GaN single-crystal thick film is grown in the diameter expanded manner and has a longitudinal growth rate of 10-200 $\mu m/h$, a transverse growth rate being 1/50-1/5 of the longitudinal growth rate, a longitudinal grown thickness of 1-10 mm, and a transverse expanded size being 1.05-1.5 times a difference between the inner diameter and the outer diameter of the metal mask ring.

7. The method according to claim 1, wherein in step 5), the chemico-mechanical trimming comprises two steps: performing mechanical cutting to remove a composite structure composed of the GaN single-crystal sacrificial layer, the nitrogen-lattice polar GaN epitaxial thin film and the single-crystal graphene under the GaN single-crystal thick film, as well as an irregular region caused by anisotropic growth at an edge of the GaN single-crystal thick film, thereby obtaining a cylindrical GaN single-crystal thick film with a diameter same as the diameter of the composite epitaxial substrate; and thermally treating the cylindrical GaN single-crystal thick film for 30-60 min at 500-700° C. in a hydrogen atmosphere having a vacuum degree of less than 1 Pa, to remove surface impurities of the GaN single-crystal thick film and surface damage caused by the mechanical cutting, and release a biaxial stress caused by the epitaxial growth and the mechanical cutting in the GaN single-crystal thick film, thereby obtaining the stress-free self-supporting GaN single-crystal substrate without diameter reduction and with a thickness of 1-10 mm.

* * * * *